(12) United States Patent
Yabu

(10) Patent No.: US 6,226,072 B1
(45) Date of Patent: May 1, 2001

(54) STAGE SYSTEM AND EXPOSURE APPARATUS WITH THE SAME

(75) Inventor: Shuichi Yabu, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/219,596

(22) Filed: Dec. 23, 1998

(30) Foreign Application Priority Data

Dec. 26, 1997 (JP) .................................................. 9-359805

(51) Int. Cl.[7] ............................. G03B 27/42; G03B 27/58
(52) U.S. Cl. ............................................. 355/53; 355/72
(58) Field of Search ........................ 355/53, 72; 356/399, 356/358; 33/568

(56) References Cited

U.S. PATENT DOCUMENTS 5,172,160   12/1992   Van Eijk et al. ..................... 355/53
5,610,686 * 3/1997   Osanai ................................... 355/72

FOREIGN PATENT DOCUMENTS

| 6-163353 | 6/1994 | (JP) . |
| 9-4677 | 1/1997 | (JP) . |
| WO 96/38765 | 12/1996 | (WO) . |

* cited by examiner

*Primary Examiner*—Peter B. Kim
(74) *Attorney, Agent, or Firm*—Fitzpatrick, Cella, Harper & Scinto

(57) ABSTRACT

A stage system includes a movable stage, a base for movably supporting the stage, a table mounted on a floor substantially integrally therewith, for supporting the base, a driving mechanism for moving the stage, a reactive force receiving member for receiving a reactive force produced with movement of the stage, and an earth member provided substantially independently of the floor with respect to vibration, for releasing a force outwardly, wherein the reactive force receiving member and the earth member have at least one connection.

10 Claims, 8 Drawing Sheets

US 6,226,072 B1

STAGE SYSTEM AND EXPOSURE APPARATUS WITH THE SAME

FIELD OF THE INVENTION AND RELATED ART

This invention relates generally to a stage system for accurate positioning. More particularly, the invention is concerned with a stage system usable in a semiconductor exposure apparatus such as a stepper or scanning exposure apparatus, for example. In another aspect, the invention relates to an exposure apparatus or a device manufacturing method, using such a positioning system, for the manufacture of devices such as semiconductor devices.

For enlargement of productivity of an exposure apparatus, stage movement time and/or exposure time has to be reduced. For reduced stage movement time, the acceleration or deceleration speed during movement should be increased. On the other hand, for enlargement of productivity in post-processing procedure, the wafer diameter should be large and, in this connection, the mass of a wafer chuck or wafer stage has to be enlarged.

A stage driving mechanism should provide a thrust corresponding to the product of the mass of a stage and the acceleration thereof, and the thrust to be produced by the driving mechanism must be very large due to a multiplied effect of the wafer size and acceleration. As a result of this, when the stage is driven, a large reactive force is produced which causes deformation in the major assembly of the exposure apparatus, leading to deterioration of positioning precision in lithographic transfer or distortion of a transferred pattern. A reactive force receiving mechanism may be effective to address this problem.

FIG. 9 shows an example of such a reactive force receiving mechanism.

Denoted in FIG. 9 at 41 is a stage, and denoted at 42 is a base for supporting the stage. Denoted at 43A and 43B are anti-vibration springs for reducing vibration from the floor surface. Denoted at 44 is a bottom plate fixedly mounted on the floor surface. The stage 41 is movable along the base 42 surface, through a driving mechanism (not shown) provided on the base 42. Denoted at 45 is a reactive force receiving member. A stator 47 fixed to the base 42 and a movable element 48 provided on the reactive force receiving member 45 are components of an actuator 46, for producing the thrust.

FIG. 10 illustrates forces produced in the mechanism of FIG. 9.

In the structure of FIG. 10, when the actuator 46 is inoperative, as the stage 41 of a mass m moves with an acceleration a through the driving mechanism (not shown), a reactive force ma is applied to the base 42. This reactive force ma causes deformation of the base 42 and, also, displacement of the anti-vibration spring 43, causing vibration of the bottom plate 44. In order to prevent this deformation or vibration, a force f is applied by the actuator 46 and from the reactive force receiving member 45, disposed independently of the base 42, to cancel the reactive force ma.

In a stage system having such a reactive force receiving mechanism, however, transmission of a reactive force to the floor is inevitable. As shown in FIG. 10, to the floor surface, a load ma along the surface as well as a moment load M=Lma are applied. Here, L is the distance from the gravity center position of the stage to the floor surface. Generally, the floor has a large rigidity to the load along the surface, but the rigidity to a load perpendicular to the floor surface or to the moment load is small. Therefore, due to the moment load M=Lma, floor vibration is produced. This vibration applies an adverse effect to the apparatus itself or to any other components mounted on the same floor surface.

SUMMARY OF THE INVENTION

It is an object of the present invention to provide a stage system by which floor vibration such as described above is avoided or reduced.

In accordance with an aspect of the present invention, there is provided a stage system, comprising:

a movable stage; a base for movably supporting said stage; a table mounted on a floor substantially integrally therewith, for supporting said base; a driving mechanism for moving said stage;

a reactive force receiving member for receiving a reactive force produced with movement of said stage;

and an earth member provided substantially independently of the floor, for releasing a force outwardly, wherein said reactive force receiving member and said earth member have at least one connection.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Embodiment 1

Figure 1:
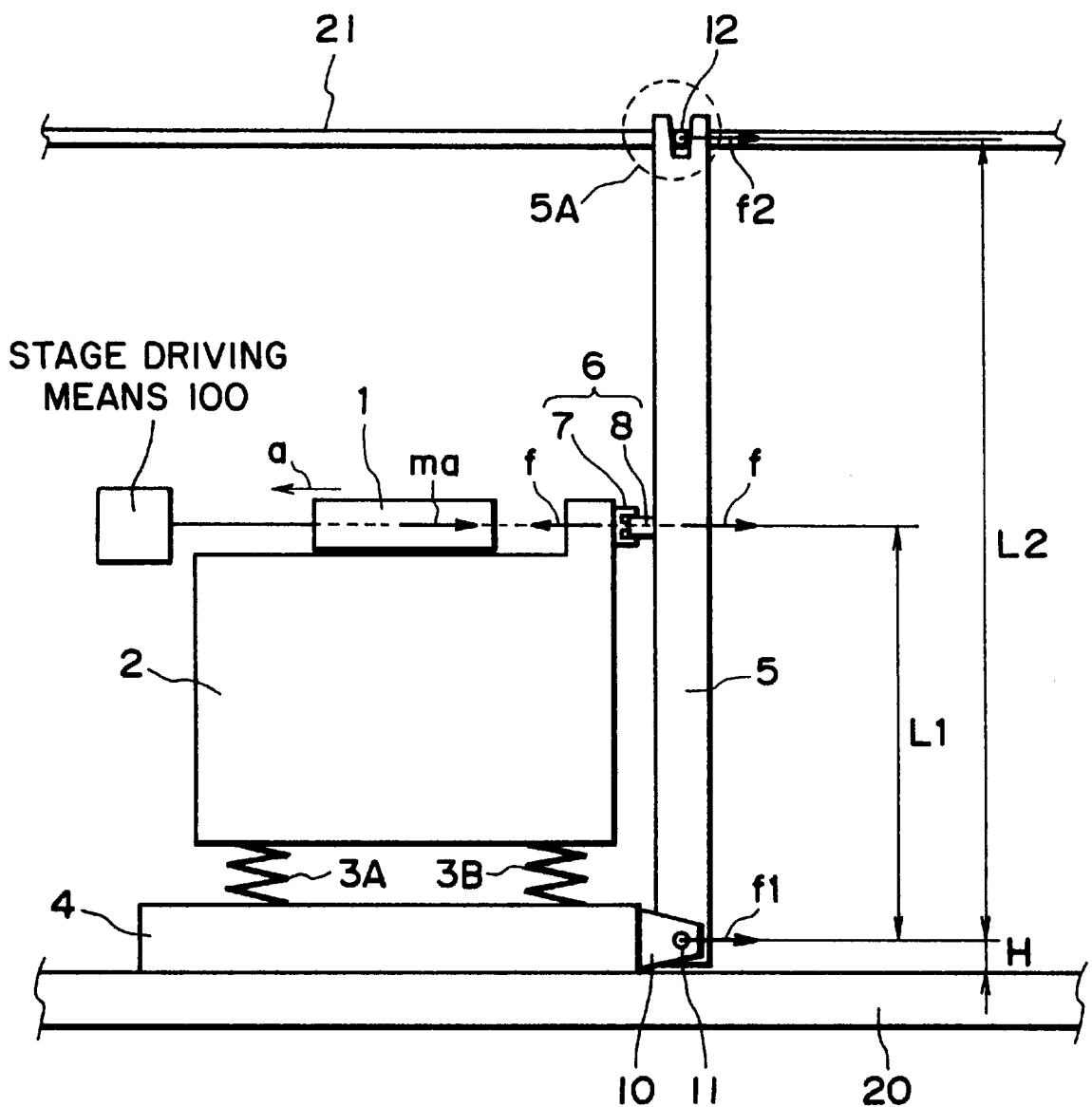
FIG. 1 is a schematic view of a stage system according to a first embodiment of the present invention.

FIG. 1 is a schematic view of a stage system according to a first embodiment of the present invention.

Denoted in FIG. 1 at 1 is a stage, and denoted at 2 is a base for supporting the stage 1. The stage 1 can be driven by a stage driving means 100 provided on the base 2. The stage driving means may comprise a linear motor or a ball screw mechanism, for example. Denoted at 3A and 3B are anti-vibration springs or dampers, for supporting the base 2 and for avoiding vibration from the floor surface. Denoted at 4 is a bottom table fixedly mounted on the floor surface, for supporting the base 2. These elements are components of a stage system.

Denoted at 5 is a reactive force receiving member. There are connecting pins 11 and 12 (providing connection points)

defined at a ceiling of a housing (building), being substantially independent of the floor 20 on which the stage system is mounted, or at a member 21 fixed to the ceiling, and the bottom table 4 being fixedly mounted on the floor and having the stage system mounted thereon. Each of these connecting pins is fitted in a notched or slotted end 5A of the reactive force receiving member 5, such that it is rotatably connected to the reactive force connecting member 5. Here, the ceiling functions as a mechanical earth for releasing a force and mechanically absorbing vibration.

Denoted at 6 is an actuator which comprises a stator 7, fixed to the base 2, and a movable element 8 provided on the reactive force receiving member 5. The actuator 6 produces a desired thrust.

Arrows in the drawing depict forces to be produced in the stage system.

When in the illustrated structure the stage 1 is moved with acceleration a through the driving mechanism 100 mounted on the base 2, a reactive force ma is applied to the base 2 from the stage 1. In order to cancel this reactive force, a force f=ma is applied to the base 2 from the reactive force receiving member 5 and through the actuator 6. As a reaction thereof, a force f is applied to the reactive force receiving member, and a force $f_1$ is applied from connector 10 of the base 2 to the connecting pin 11 of the base 2 while a force $f_2$ is applied to the connecting pin 12 of the fixed member 21 at the ceiling. Due to the structure of the connecting pin, it provides restriction with rotatability in the direction of action of force f. Thus, from the reactive force receiving member 5, no moment force is transmitted, and a force is transmitted in a direction parallel to the floor 20 surface. When the distances to the line of action from the respective connecting pins are $L_1$ and $L_2$, from the equation of balance of resultant force and from the balance of moments around the connecting pin, the forces $f_1$ and $f_2$ can be expressed as follows:

$$f_1 = (1 - L_1/L_2)f$$

$$f_2 = (L_1/L_2)f.$$

To the floor surface on which the system is set, the force $f_1$ is applied as an external force. Namely, if the distance from the floor surface to the connecting pin is H, the external force to be applied to the floor surface corresponds to the load $f_1$ along the surface and the moment load $Hf_1$. As described hereinbefore, the rigidity of the floor to a load perpendicular thereto or a moment load is small, but the rigidity to a load along the surface is large. Therefore, by setting the position of the connecting pin close as much as possible to the floor surface to make the distance H smaller, the moment load to the floor surface can be reduced more and the floor vibration can be suppressed.

In this embodiment, the reactive force receiving member for receiving a reactive force to be produced by movement of the stage is provided with a rotatable connection between the ceiling fixed member (mechanical earth) and the bottom table, by which the reactive force can be dispersed without transmission of a moment force and by which the moment force to be applied to the floor surface can be reduced. Also, with respect to the floor surface, the load $f_1$ along the surface can be made smaller than the stage reactive force f. This provides an additional floor vibration suppressing effect. Further, since the fixed member 21 at the ceiling is required only to receive the force $f_2$ as an axial force, it can be easily mounted on the ceiling of the housing where the structure should be accommodated.

An anti-vibration mechanism such as a damper, for example, for isolating vibration, may be provided between the ceiling and the floor on which the system is mounted. This improves the floor vibration suppressing effect.

Embodiment 2

Figure 2:
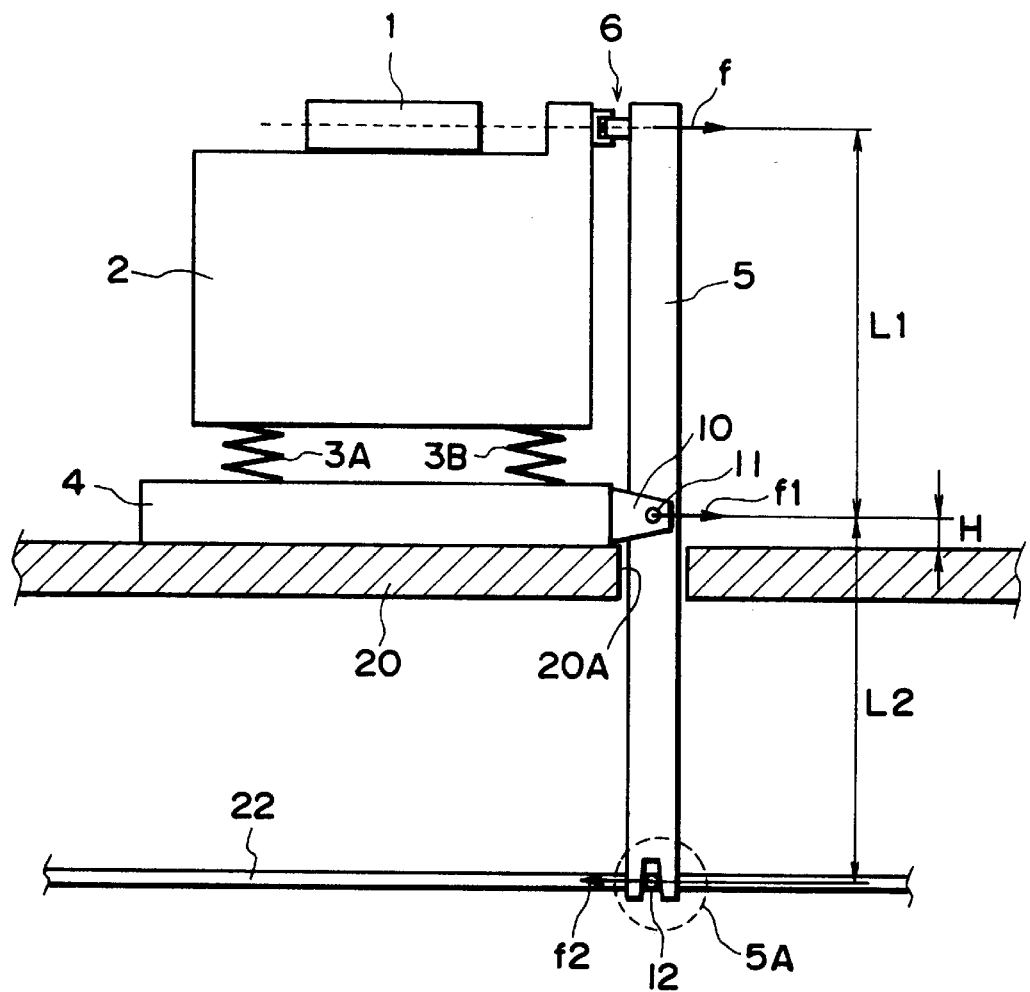
FIG. 2 is a schematic view of a stage system according to a second embodiment of the present invention.

FIG. 2 is a schematic view of a stage system according to a second embodiment of the present invention.

Components illustrated in FIG. 2 and corresponding to those of the preceding embodiment are denoted by the same reference numerals. A description therefor will be omitted. In this embodiment, connecting pins that function as a connection point are provided at the bottom table and a base structure of the housing (building) and they are connected to the reactive force receiving member. Here, the base structure of the housing is substantially independent from the floor 20 on which the stage mechanism is mounted, with respect to vibration.

In FIG. 2, denoted at 4 is a bottom table. Denoted at 22 is a member which is fixed to the base structure of the housing in which the stage mechanism is accommodated. Denoted at 5 is a reactive force receiving member. The table 4 and the fixed member 22 at the base structure are provided with connecting pins 11 and 12, respectively. The reactive force receiving member 5 sandwiches these connecting pins, to define rotatable restriction points there. Here, the base structure of the housing functions as a mechanical earth for releasing a force outwardly and for mechanically absorbing vibration.

In the structure of FIG. 2, a force f to be applied to the reactive force receiving member 5 as a stage reactive force is applied to the connecting pin 12 at the base structure of the housing, as force $f_2$. Because of the structure of the connecting pin, it provides restriction with rotatability in the direction of action of force f. Therefore, no moment is transmitted from the reactive force receiving member, and a force in a direction parallel to the floor surface is transmitted. When the distances from the respective connection pins to the line of action of the force f are $L_1$ and $l_2$, forces $f_1$ and $f_2$ can be expressed as follows:

$$f_1 = (1 + L_1/L_2)f$$

$$f_2 = (L_1L/L_2)f.$$

To the floor surface on which the system is set, the force $f_1$ is applied as an external force. Namely, if the distance from the floor surface to the connecting pin is H, the external force to be applied to the floor surface corresponds to the load $f_1$ along the surface and the moment load $Hf_1$. As described hereinbefore, the rigidity of the floor to a load perpendicular thereto or a moment load is small, but the rigidity to a load along the surface is large. Therefore, by setting the position of the connecting pin close as much as possible to the floor surface to make the distance H smaller, the moment load to the floor surface can be reduced more and the floor vibration can be suppressed.

In this embodiment, the reactive force receiving member for receiving a reactive force to be produced by movement of the stage is provided with a rotatable connection at the connecting pin, by which the reactive force can be dispersed without transmission of a moment force and by which the moment force to be applied to the floor surface can be reduced. Also, since the member fixed at the base structure of the housing is required only to receive the force $f_2$ as an axial force, it can be easily mounted on the base structure of the housing where the stage mechanism should be accommodated.

An anti-vibration mechanism such as a damper, for example, for isolating vibration, may be provided between the floor on which the system is mounted and the base structure of the housing. This improves the floor vibration suppressing effect.

Embodiment 3

Figure 3:
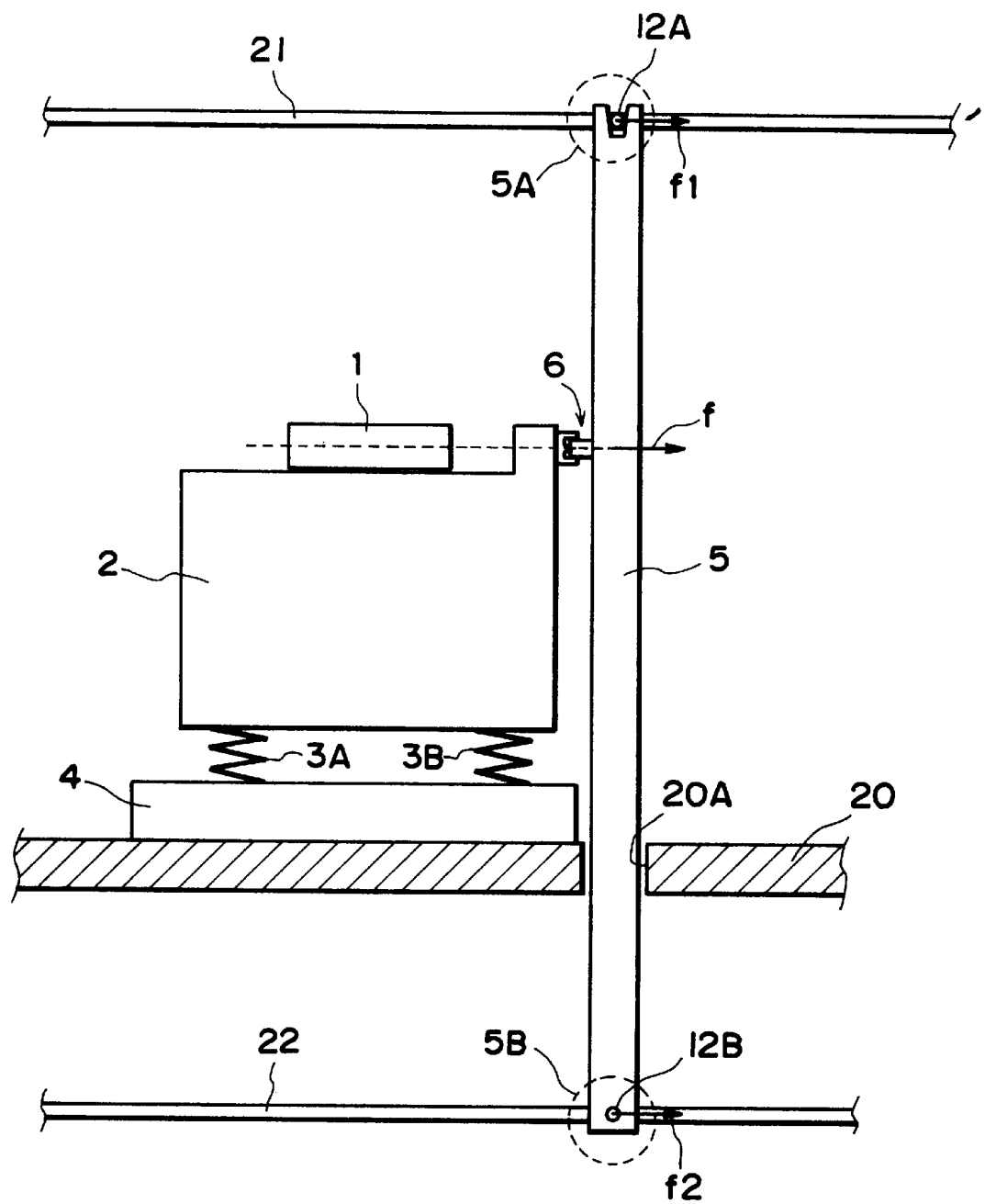
FIG. 3 is a schematic view of a stage system according to a third embodiment of the present invention.

FIG. 3 is a schematic view of a stage system according to a third embodiment of the present invention.

Components illustrated in FIG. 3 and corresponding to those of the preceding embodiments are denoted by the same reference numerals. A description therefor will be omitted. In this embodiment, connecting pins that function as a connection point are provided at the ceiling or a fixed member at the ceiling and a base structure of the housing (building), and they are connected to the reactive force receiving member.

In FIG. 3, denoted at 21 is the ceiling of a housing where the stage mechanism is accommodated or a member which is fixed to the ceiling. Denoted at 22 is a member which is fixed to the base structure of the housing Denoted at 5 is a reactive force receiving member. There are connecting pins for functioning as connection points, pin 12A at the member 21 fixed to the ceiling which is substantially independent from the stage mechanism with respect to vibration, and pin 12B at the member 22 fixed to the base structure of the housing where the stage mechanism is set, by which a rotatable connection 5B to the reactive force receiving member is provided.

Here, the fixed member 21 at the ceiling and the base structure 22 of the housing function as a mechanical earth for releasing a force outwardly and for mechanically absorbing vibration.

In the structure of FIG. 3, force f to be applied to the reactive force receiving member 5 as a stage reactive force is applied to the connecting pin 12A of the fixed member at the ceiling as force $f_1$ and to the connecting pin 12B at the base structure of the housing as force $f_2$. It does not apply influence to the floor surface 20.

In this embodiment, the force is dispersed to the member fixed to the ceiling and the base structure of the housing where the stage mechanism is accommodated. Because of the structure of the connecting pin, it provides a restriction with rotatability in the direction of action of force f. Therefore, no moment is transmitted from the reactive force receiving member, and a force in a direction parallel to the floor surface is transmitted. As a result, since the member fixed at the base structure and the member fixed to the ceiling of the housing are required only to receive this force as an axial force, it can be easily mounted there with a simple structure.

In this embodiment, although connecting pins which function as a restriction point are provided at the members fixed to the ceiling and base structure, it is not always necessary to provide them separately at the ceiling and the base structure. Both of them may be provided at the ceiling or at the base Structure.

Embodiment 4

Figure 4:
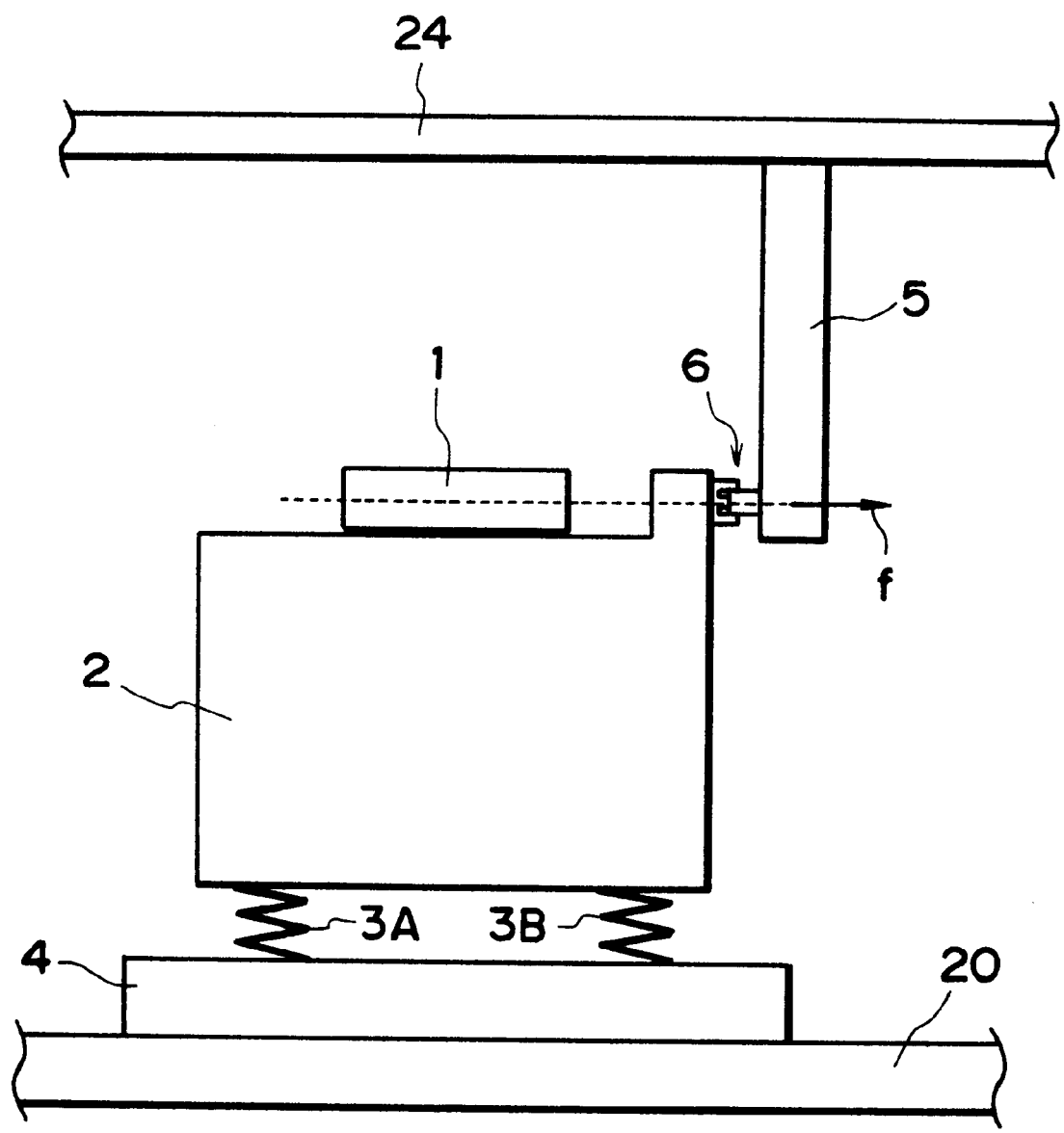
FIG. 4 is a schematic view of a stage system according to a fourth embodiment of the present invention.

FIG. 4 is a schematic view of a stage system according to a fourth embodiment of the present invention.

Components illustrated in FIG. 4 and corresponding to those of the preceding embodiments are denoted by the same reference numerals. A description therefor will be omitted. In this embodiment, there is no connecting pin rotatably restricted, as in the preceding embodiment. The restriction point is fixed, and a moment force is transmitted.

In FIG. 4, denoted at 24 is a member which is fixed to the ceiling of the housing where the stage mechanism is accommodated. The reactive force receiving member is connected to the member 24, at the restriction point. In this case, as compared with the rotatable connection point in the preceding embodiment, the restriction point is fixed without freedom. Here, the ceiling of the housing functions as a mechanical earth for absorbing vibration.

Since the reactive force receiving member is not connected to the floor surface or a member such as a bottom table 4 fixed on the floor surface, the force f applied to the reactive force receiving member as a stage reactive force is all applied to the member 24 which is fixed to the ceiling.

In this embodiment, since the reactive force receiving member is fixed to the member 24 which is fixed to the ceiling, there is only one restriction point for the reactive force receiving member. As a result, no external force or moment force is transmitted to the floor surface or a member, such as the bottom table, fixedly mounted on the floor surface. Thus, a floor surface vibration suppressing effect is provided. It is to be noted here that the number of restriction points is not limited to one. Further, since the force f applied to the reactive force receiving member as a stage reactive force is all applied to the member 24 fixed at the ceiling, there is no effect such as an external force or vibration, for example, applied to the floor surface.

Figure 5:
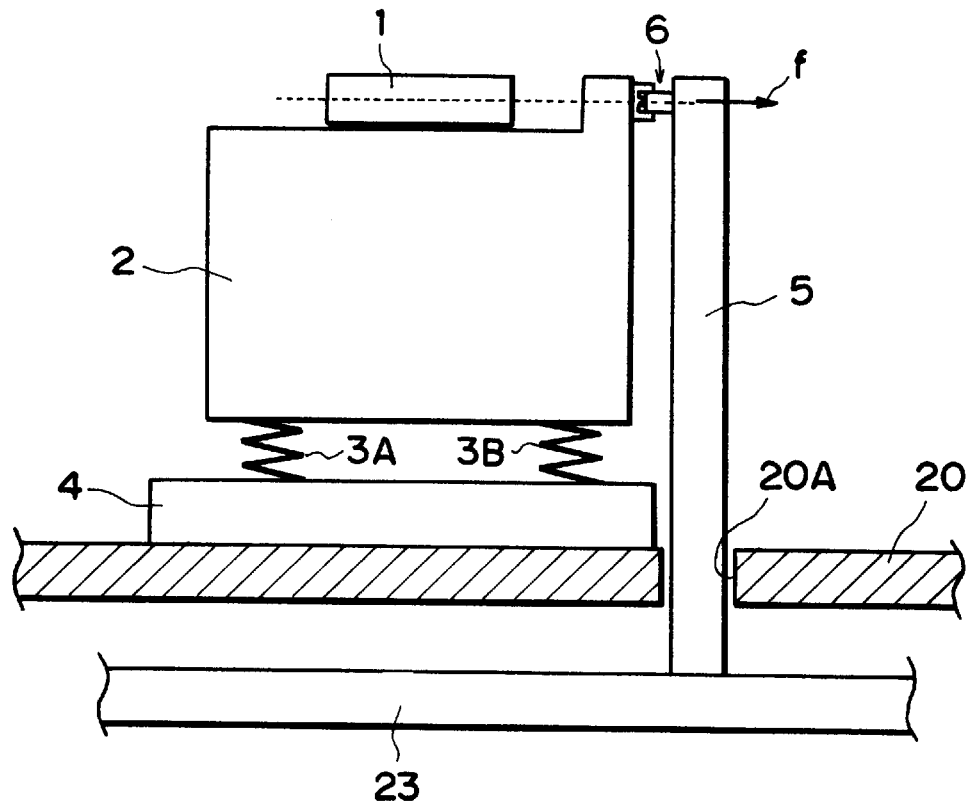
FIG. 5 is a schematic view of a stage system according to a modified form of the fourth embodiment of the present invention.

An alternative is illustrated in FIG. 5 wherein the reactive force receiving member may be fixed to a member 23 which is fixedly mounted on the base structure of the housing where the stage mechanism is accommodated. On that occasion, the force f applied to the reactive force receiving member 5 as a stage reactive force is all applied to the member fixed to the base structure of the housing, and a similar effect is attainable. An anti-vibration mechanism such as a damper, for example, for isolating vibration, may be provided between the housing or the floor of the housing and the base structure of the housing where the stage mechanism is mounted. This improves the floor vibration suppressing effect further.

Embodiment 5

Figure 6:
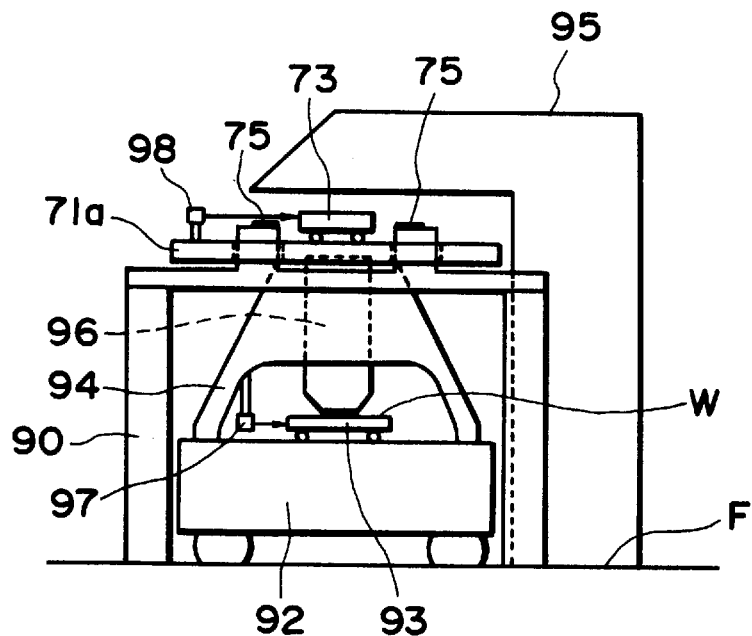
FIG. 6 is a schematic view of an exposure apparatus having a stage system according to the present invention.

Referring to FIG. 6, an embodiment of a scanning type exposure apparatus having a stage system according to any one of the preceding embodiments, as a reticle stage, will now be described.

A light source-device 95 produces exposure light with which a wafer W placed on a water stage 93 is to be exposed through a reticle placed on a reticle stage 73. Alignment devices 75 for the reticle stage 73 are mounted on frame 90.

Frame 94 functions to support a reticle stage base 71a and also to support a projection optical system 96 between the reticle stage 73 and the wafer stage 93. Wafer stage 93 is supported by stage table 92.

The wafer stage 93 can be scanningly moved in synchronism with the reticle stage 73, by driving means During scanning movement of the reticle stage 73 and the wafer stage 93, the positions of them are continuously detected by means of interferometers 97 and 98. The results of detection are fed back to the driving means for the reticle stage 73 and the wafer stage 93, respectively. This enables correct synchronization of scan start positions of the stages as well as high precision control of scan speeds in constant-speed scan regions.

Embodiment 6

Next, an embodiment of a semiconductor device manufacturing method which uses an exposure apparatus such as described above, will be explained.

Figure 7:
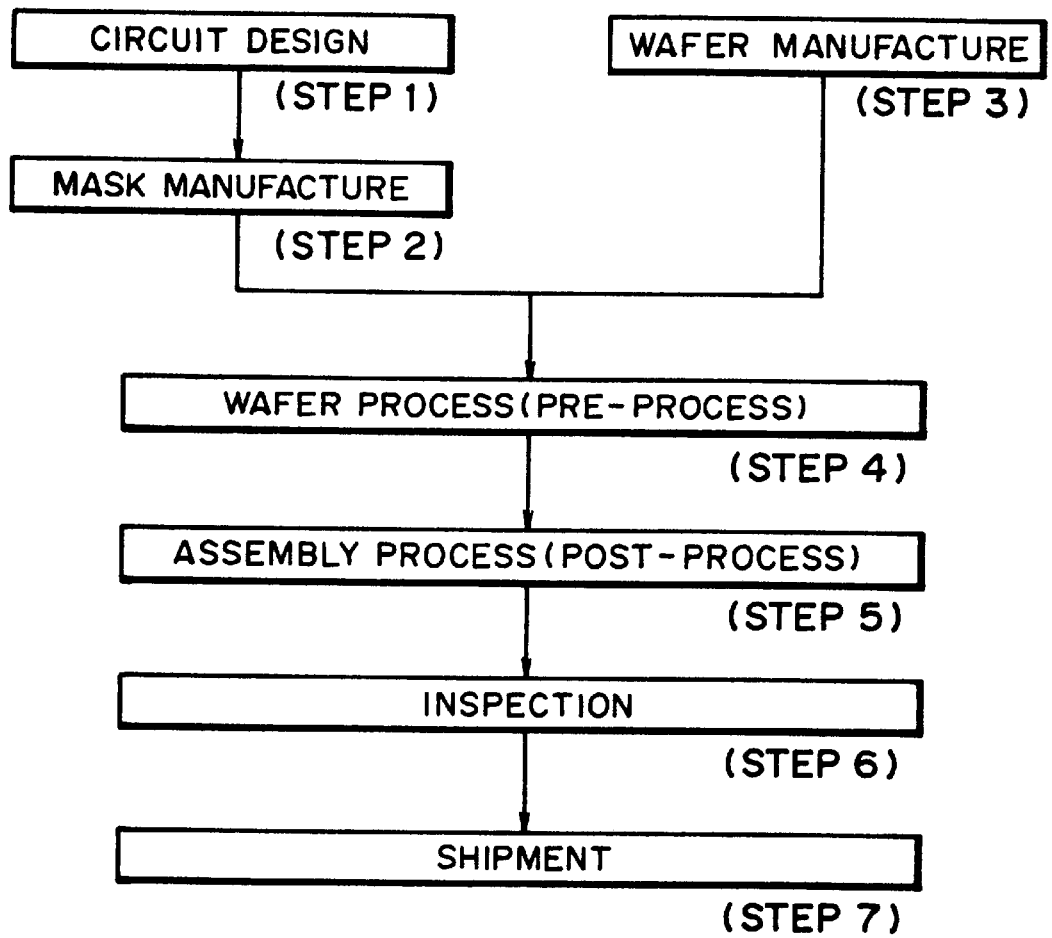
FIG. 7 is a flow chart of a semiconductor device manufacturing method.

FIG. 7 is a flow chart of a procedure for the manufacture of microdevices such as semiconductor chips (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check a durability check and so on for the semiconductor devices provided by step 5, are carried out. With these processes, semiconductor devices are completed and they are shipped (step 7).

Figure 8:
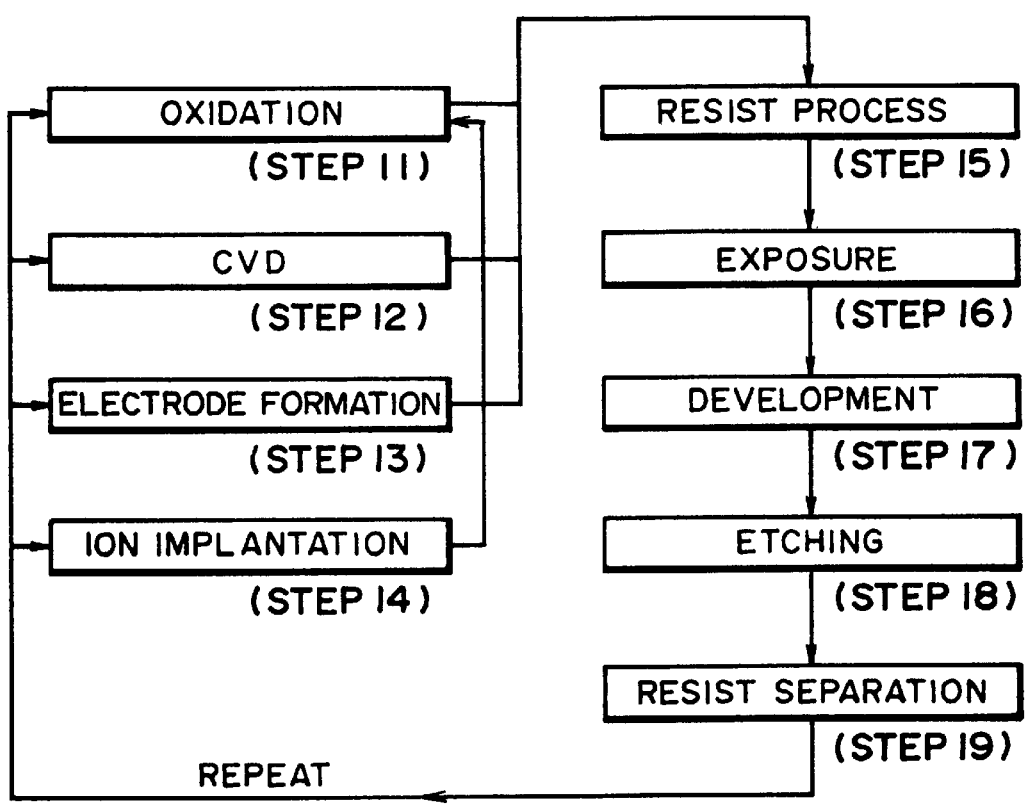
FIG. 8 is a flow chart of a wafer process.
Figure 9:
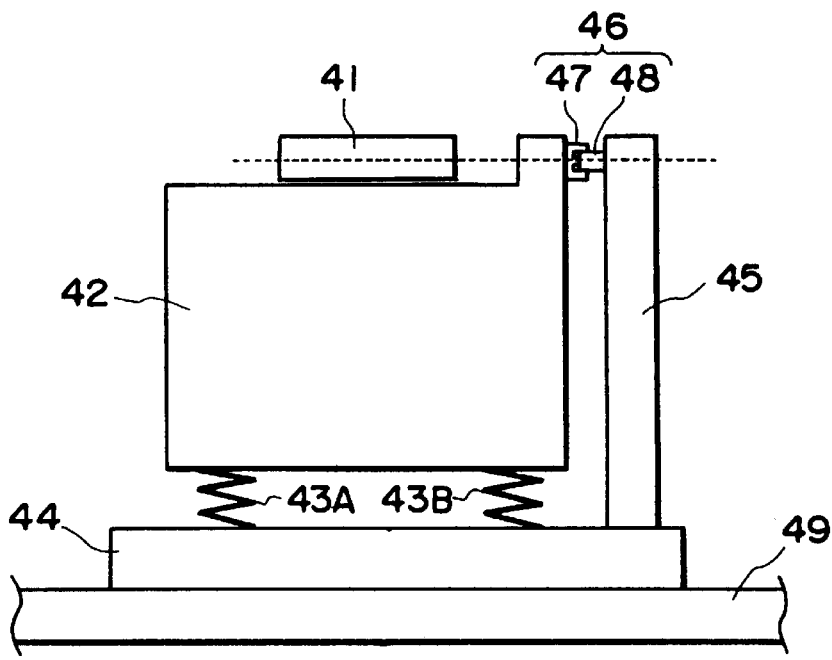
FIGS. 9 and 10 are schematic views, respectively, for explaining problems involved in a stage system.
Figure 10:
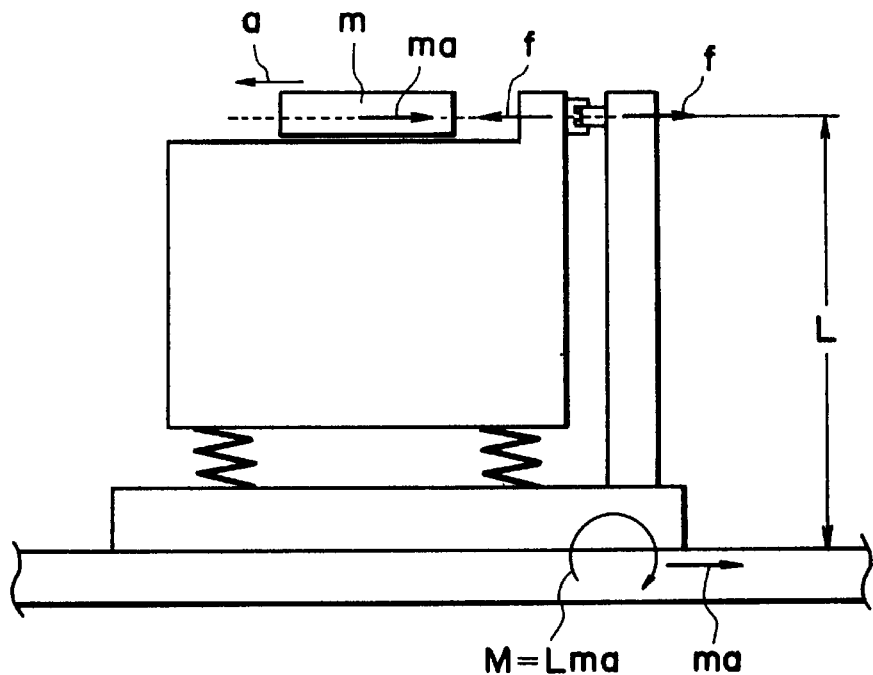

FIG. 8 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices or semiconductor devices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A stage system, comprising:

a movable stage;

a base for movably supporting said stage;

a table mounted on a floor substantially integrally therewith, for supporting said base;

a driving mechanism for moving said stage;

a reactive force receiving member for receiving a reactive force produced with movement of said stage; and an earth member, provided substantially independently of the floor with respect to vibration, for releasing the reactive force outwardly without transmitting a moment load to the floor, wherein said reactive force receiving member and said earth member have at least one connection.

2. A stare system according to claim 1, wherein said at least one connection comprises a rotatable connection.

3. A stage system according to claim 2, wherein said reactive force receiving member is connected to said table through said rotatable connection.

4. A stage system according to claim 1, wherein said connection is set fixed without freedom.

5. A stage system according to claim 1, further comprising at least two of said earth members, wherein said reactive force receiving member has respective connections with each of said earth members.

6. A stage system according to claim 1, wherein said earth member comprises one of a base structure of a housing in which said stage system is accommodated, a ceiling of the housing, and a member fixed to the ceiling.

7. A stage system according to claim 1, further comprising an actuator for producing a force between said base and said reactive force producing member.

8. A stage system according to claim 1, further comprising a damper for supporting said base by said table.

9. An exposure apparatus, comprising:

a light source device for providing exposure light; and a stage system for mounting, thereon, one of a wafer and a reticle, wherein said stage system includes (i) a movable stage, (ii) a base for movably supporting said stage, (iii) a table mounted on a floor substantially integrally therewith, for supporting said base, (iv) a driving mechanism for moving said stage, (v) a reactive force receiving member for receiving a reactive force produced with movement of said stage, and (vi) an earth member, provided substantially independently of the floor with respect to vibration, for releasing the reactive force outwardly without transmitting a moment load to the floor, and wherein said reactive force receiving member and said earth member have at least one connection.

10. A device manufacturing method, comprising the steps of:

applying a photosensitive material to a wafer;

exposing the wafer by use of an exposure apparatus; and developing the exposed wafer, wherein the exposure apparatus includes (i) a movable stage, (ii) a base for movably supporting the stage, (iii) a table mounted on a floor substantially integrally therewith, for supporting the base, (iv) a driving mechanism for moving the stage, (v) a reactive force receiving member for receiving a reactive force produced with movement of the stage, and (vi) an earth member, provided substantially independently of the floor with respect to vibration, for releasing the reactive force outwardly without transmitting a moment load to the floor, and wherein the reactive force receiving member and the earth member have at least one connection.

* * * * *

UNITED STATES PATENT AND TRADEMARK OFFICE
CERTIFICATE OF CORRECTION

PATENT NO. : 6,226,072 B1
DATED : May 1, 2001
INVENTOR(S) : Shuichi Yabu

Page 1 of 1

It is certified that error appears in the above-identified patent and that said Letters Patent is hereby corrected as shown below:

<u>Title page,</u>
Under "Foreign Application Priority Data", "9-359805" should read -- 9-359802 --.

<u>Column 3,</u>
Line 50, "close as much" should read -- as close --.

<u>Column 4,</u>
Line 38, "$1_2$" should read -- $L_2$ --.
Line 43, "$f_2=(L_1L/L_2)f$." should read -- $f_2=(L_1/L_2)f$ --.
Line 53, "close as much" should read -- as close --.

<u>Column 5,</u>
Line 56, "Structure." should read -- structure. --.

<u>Column 6,</u>
Lines 11, 22 and 30, "all" should read -- entirely --.
Line 52, "means" should read -- means. --.
Line 54, "the positions of them" should read -- their positions --.

<u>Column 7,</u>
Line 14, "check" should read -- check, --.

<u>Column 8,</u>
Line 1, "stare" should read -- stage --.

Signed and Sealed this

Twenty-sixth Day of February, 2002

Attest:

*Attesting Officer*

JAMES E. ROGAN
*Director of the United States Patent and Trademark Office*